(12) United States Patent
Yamano et al.

(10) Patent No.: US 7,250,329 B2
(45) Date of Patent: Jul. 31, 2007

(54) METHOD OF FABRICATING A BUILT-IN CHIP TYPE SUBSTRATE

(75) Inventors: Takaharu Yamano, Nagano (JP); Tadashi Arai, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 11/141,421

(22) Filed: May 31, 2005

(65) Prior Publication Data

US 2005/0266609 A1   Dec. 1, 2005

(51) Int. Cl.
   *H01L 21/44* (2006.01)
(52) U.S. Cl. ............................... 438/109; 257/E27.026
(58) Field of Classification Search .................. 438/15, 438/22–27, 128, 109–111, 189, 64, 106–107, 438/18
   See application file for complete search history.

(56) References Cited

U.S. PATENT DOCUMENTS

| 5,126,818 | A | | 6/1992 | Takami et al. | |
|---|---|---|---|---|---|
| 5,956,575 | A | * | 9/1999 | Bertin et al. | 438/110 |
| 6,090,944 | A | * | 7/2000 | Hutchinson | 546/122 |
| 6,190,944 | B1 | * | 2/2001 | Choi | 438/109 |
| 6,372,527 | B1 | * | 4/2002 | Khandros et al. | 438/15 |
| 2002/0004257 | A1 | * | 1/2002 | Takaoka et al. | 438/107 |
| 2002/0133943 | A1 | * | 9/2002 | Sakamoto et al. | 29/846 |
| 2003/0148558 | A1 | * | 8/2003 | Kubo et al. | 438/128 |

FOREIGN PATENT DOCUMENTS

| JP | 01-112743 | 5/1987 |
|---|---|---|
| JP | 2001217381 | 8/2001 |
| JP | 2002-026048 | 1/2002 |

\* cited by examiner

*Primary Examiner*—Michael Lebentritt
*Assistant Examiner*—Andre' Stevenson
(74) *Attorney, Agent, or Firm*—Ladas & Parry LLP

(57) ABSTRACT

A method of fabricating a built-in chip type substrate containing a semiconductor chip is disclosed. The method comprises a first step of mounting the semiconductor chip on a substrate; a second step of forming chip connection wiring connected to the semiconductor chip mounted on the substrate; and a step of forming an alignment post on the substrate before the first step, the alignment post being used for positioning the chip connection wiring.

5 Claims, 3 Drawing Sheets

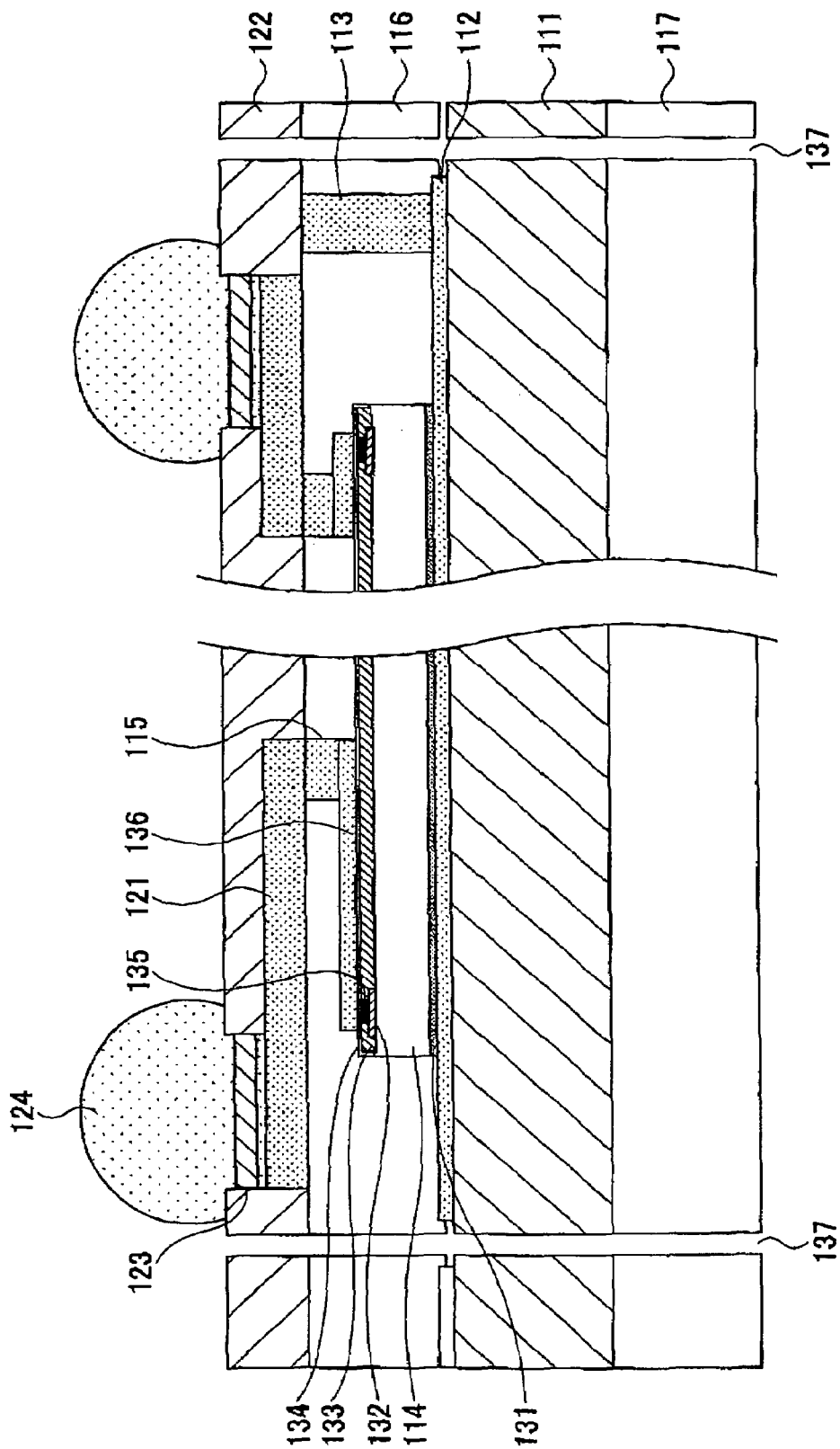

METHOD OF FABRICATING A BUILT-IN CHIP TYPE SUBSTRATE

BACKGROUND OF THE INVENTION

The present invention generally relates to a method of fabricating a built-in chip type substrate containing a semiconductor chip.

Recently and continuing, performance of electronic apparatuses using semiconductor devices such as semiconductor chips is becoming higher and higher, and it is required to highly integrate and miniaturize substrates on which semiconductor chips are mounted.

For this purpose, built-in chip type substrates in which a semiconductor chip is embedded are proposed, and further a variety of structures are proposed for such substrates containing semiconductor chips.

When forming such built-in chip type substrates, it is necessary to form wirings connected to semiconductor chips. Density and fineness of the wirings connected to the semiconductor chips are becoming higher and higher.

[Patent Document #1]

Japanese Laid-open Publication 2001-217381

However, as the density and fineness of such wirings connected to semiconductor chips become higher, the above explained built-in chip type substrates have the following problem. The accuracy of connection between the wirings and the semiconductor chips is difficult to control and therefore throughput of the substrate is lowered due to connection failures.

The main cause of such connection failures is poor accuracy of exposure position in photolithographic processes for patterning wirings connected to semiconductor chips. Thus it is desired to improve the accuracy of positioning wirings, compared to conventional exposure accuracy.

SUMMARY OF THE INVENTION

A general object of the present invention is to provide a method of fabricating built-in chip type substrates solving the above problem. A further object is to provide a method of fabricating built-in chip type substrates in which the positioning accuracy of wirings connected to semiconductor chips is improved to reduce wiring failure occurrence.

The above object of the present invention is achieved by a method of fabricating a built-in chip type substrate containing a semiconductor chip comprising: a first step of mounting the semiconductor chip on a substrate; a second step of forming a chip connection wiring connected to the semiconductor chip mounted on the substrate; and a step of forming an alignment post on the substrate before the first step, the alignment post being used for positioning the chip connection wiring.

In the above method, the alignment post may be used for positioning stepper exposure of resist that patterns the chip connection wiring. The chip connection wiring may be formed on an insulation layer formed on the semiconductor chip. The alignment post may be used for positioning the semiconductor chip to be mounted on the substrate. The alignment post may be formed by Cu plating.

BRIEF DESCRIPTION OF THE DRAWINGS

FIG. 2 schematically shows a cross section of a built-in chip type substrate fabricated by the first embodiment method.

DESCRIPTION OF THE PREFERRED EMBODIMENTS

Figure 1A:
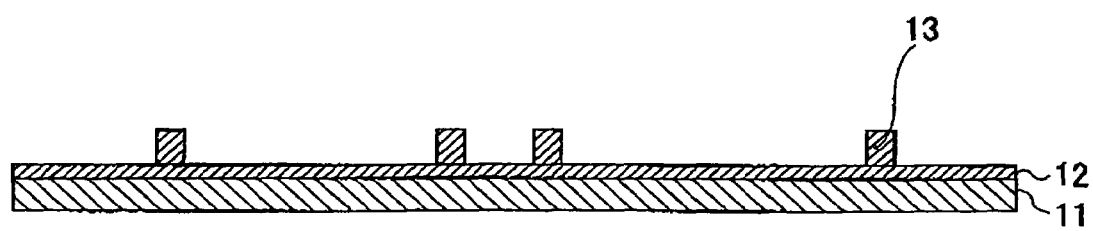
FIGS. 1A through 1H show a process of fabricating a built-in chip type substrate according to a first embodiment of the present invention.

The following is a description of embodiments of the present invention, with reference to the accompanying drawings.

Throughout all the figures, members and parts having the same or similar functions are assigned the same or similar reference numerals or symbols, and redundant explanations are omitted.

First Embodiment

A method of fabricating a built-in chip type substrate containing a semiconductor chip according to a first embodiment of the present invention is explained step by step with reference to FIG. 1A through FIG. 1H.

In a fabricating step shown in FIG. 1A, alignment posts 13 made of, for example, Cu are formed on a substrate 11. A variety of materials can be used for the substrate 11, for example, a core substrate made of resin material. The alignment posts 13 can be formed so as to directly contact the substrate. Alternatively the alignment posts 13 can be formed on a primary layer or a foundation layer 12 formed on the substrate 11, as shown in FIG. 1A. The primary layer 12 may comprise wiring patterns and an insulation layer that is formed between the wiring patterns. The wiring patterns in the primary layer 12 are not shown in FIG. 1A.

The alignment posts 13 will be used as references for positioning patterns in a later process in which chip connection wirings are patterned for connecting with the semiconductor chip. The alignment posts 13 can also be used as references for positioning the semiconductor chip on the substrate.

The alignment posts 13 can be formed by a Cu electrolytic plating patterning method, such as the semi-additive method. In this method, the alignment posts can be made of the same material and by the same method as those for forming wiring patterns such as the chip connection wirings, and therefore the material and equipment can be advantageously commonly utilized. A method for forming the alignment posts is not limited to Cu plating methods, but can be a variety of methods using a variety of materials.

Figure 1B:
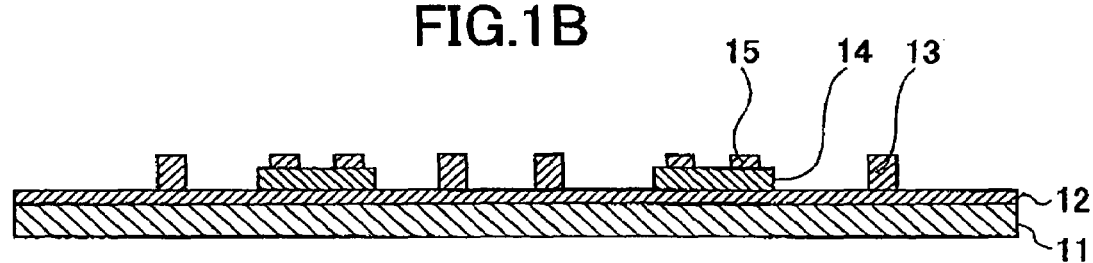

Next, in a step shown in FIG. 1B, semiconductor chips 14 are mounted on the primary layer 12 on the substrate 11. An adhesive layer (not shown) can be mounted on a surface of the substrate 11 opposite to the semiconductor chip 14. The adhesive layer can be tape (a die attaching film) or brazing material.

Aluminum electrode pads (not shown) can be formed on the semiconductor chips 14, and plural wiring posts 15 connected to the electrode pads are made to stand on the semiconductor chips 14.

Figure 1C:
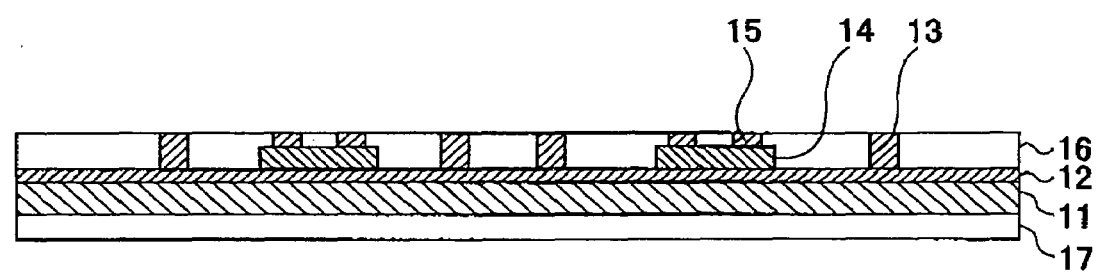

In a step shown in FIG. 1C, an insulation film made of epoxy resin is laminated on the substrate 11 so as to cover the semiconductor chips 14, the alignment posts 13 and the primary layer 12, and is pressed and heated if necessary for hardening to form an insulation layer 16. The insulation layer 16 is subjected to an ashing process by plasma processing, so as to expose the tops of the alignment posts 13 and the wiring posts 15. A wet process referred to as de-smear process can be performed after the ashing process in which smears remaining after the ashing process are removed by acid solution.

On the surface of the substrate 11 opposed to the insulation layer 16, an insulation layer 17 made of the same material as the insulation layer 16 can be formed. The insulation layer 17 can alleviate stress in the substrate 11 caused by the insulation layer 16 to suppress warping of the substrate 11.

Figure 1D:
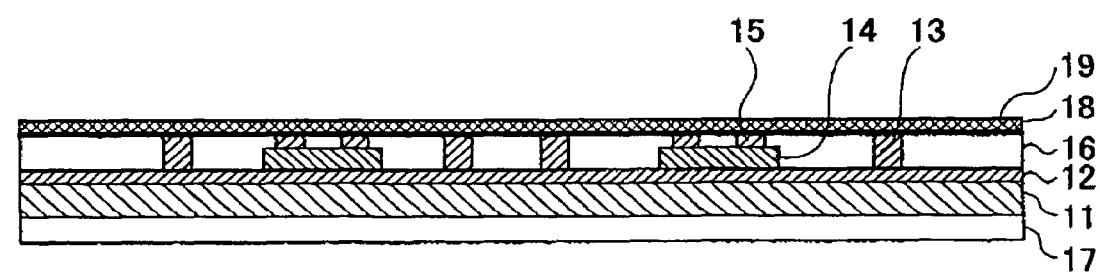

In a step shown in FIG. 1D, a Cu seed layer 18 for seeding in a later Cu electrolytic plating process is formed by Cu electrolytic plating, so as to cover the insulation layer 16, the alignment posts 13 and the wiring posts 15. Additionally, a resist layer 19 is laminated on the Cu seed layer 18 for forming wiring patterns of Cu electrolytic plating. The resist layer 19 can be formed by coating.

Figure 1E:
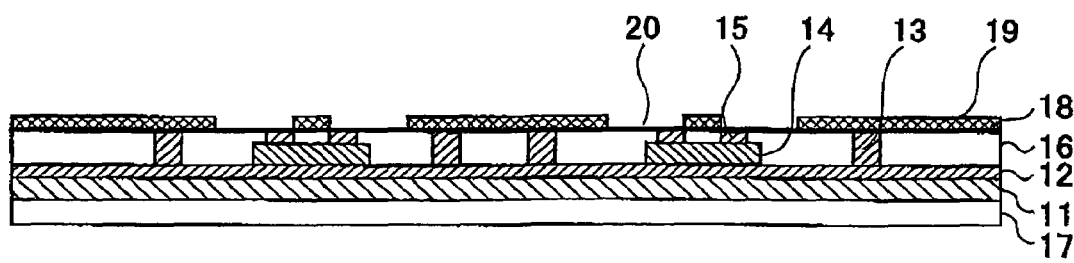

In a step shown in FIG. 1E, the resist layer 19 is exposed and developed for patterning. The patterned resist layer 19 will be used to pattern chip connection wirings to be connected to the wiring posts 15. The exposure of the resist layer 19 is performed using the alignment posts 13 as positioning references. Therefore, the exposure step can be done by using a stepper apparatus having similar accuracy to that of an exposing machine for forming devices on the semiconductor chips 14. Contact aligners conventionally used in prior exposure steps are not so accurate with respect to positioning of the exposed places, resulting in connection failures of wirings.

In this embodiment, the alignment posts 13 are provided on the substrate 11 to form recognition marks as references for exposing position accuracy. Therefore, a stepper apparatus having highly precise positioning accuracy which is used in a so-called front-end process for forming devices in a semiconductor wafer can be utilized for exposing the resist layer 19. Accordingly, the positioning accuracy (alignment accuracy) of the resist pattern becomes much improved compared to conventional contact aligners, resulting in more accurate wiring positioning (alignment accuracy) to reduce connection failures.

In the step shown in FIG. 1B, the alignment posts 13 can also be used as references for positioning (aligning) a chip mounter, by which the semiconductor chips 14 are mounted on the substrate 11. As a result, the positioning accuracy of mounting the semiconductor chips becomes much improved.

In this manner, the use of the alignment posts 13 improves the alignment accuracy of wirings in the built-in chip type substrate. The alignments posts can also be used as positioning references for mounting chips to further lower the probability that wiring connection failures occur.

Although the alignment posts 13 can be formed at various places on the substrate 11, it is desired to place the alignment posts 13 in the neighborhood of the semiconductor chips 14.

Figure 1F:
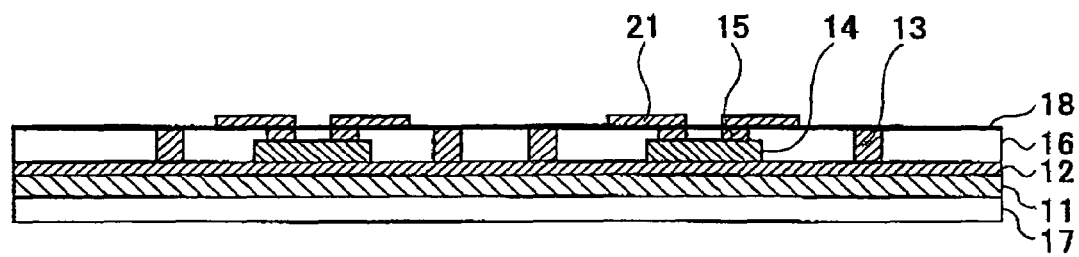

In a step shown in FIG. 1F, chip connection wirings 21 electrically connected to the wiring posts 15 are formed in the patterned (removed by development) openings 20 in the resist 19, by a Cu electrolytic plating method using the Cu seed layer 18. Then the resist 19 is removed.

Figure 1G:
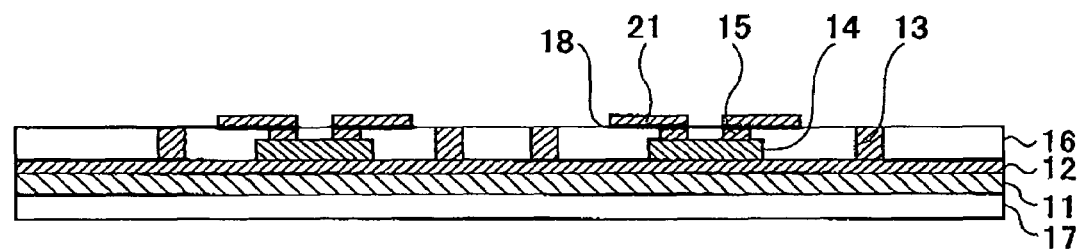

In a step shown in FIG. 1G, portions of the Cu seed layer that are not covered with the chip connection wirings 21 are removed by etching.

Figure 1H:
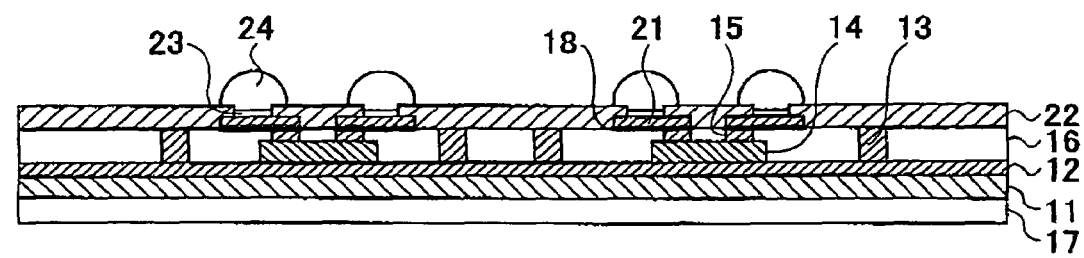

In a step shown in FIG. 1H, a solder resist layer 22 is formed so as to cover the insulation layer 16, the alignment posts 13 and the chip connection wirings 21. Openings communicating to the chip connection wirings 21 are provided in the solder resist layer 22 and Ni/Au plating layers 23 are formed on the chip connection wirings 21 and in the openings.

Further, solder balls 24 electrically connected to the Ni/Au plating layers 23 are formed. Then the substrate is divided into pieces by dicing if necessary, to obtain built-in chip type substrates containing a semiconductor chip.

Other semiconductor chips or other electronic devices or parts can be mounted and connected to the solder balls 24 if necessary.

Embodiment 2

FIG. 2 is a cross-sectional schematic view of a built-in chip type substrate formed according to the first embodiment of the present invention.

As shown in FIG. 2, the built-in chip type substrate according to this embodiment comprises a substrate 111 made of, for example, resin material. On the substrate 111, a primary layer or foundation layer 112 comprising patterned wiring layers is formed. A semiconductor chip 114 is mounted on the primary layer 112. The semiconductor chip 114 is fixed to the primary layer 112 by an adhesive layer 131.

Electrode pads 132 made of, for example, aluminum are formed on the semiconductor chip 114 and connected to devices formed in the semiconductor chip 114. A protection layer 133 made of, for example, SiN is formed so as to cover the device forming surface and the electrode pads 132. Further, an external protection layer 134 is formed on the protection layer 133.

Within openings formed in the external protection layer 134 and the protection layer 133, wirings 135 made of, for example, Cu plating are formed so as to be connected to the electrode pads 132. On the external protection layer 134, wirings 136 patterned by Cu plating are formed so as to be connected to the wirings 135. On the wirings 136, wiring posts patterned by Cu plating are formed. The wiring posts 115 according to this embodiment correspond to the wiring posts 15 explained in the first embodiment.

On the primary layer 112, an alignment post 113 made of, for example, Cu plating is formed. The alignment post 113 according to this embodiment corresponds to the alignment post 13 explained in the first embodiment, and has similar functions and gives similar advantages.

An insulation layer 116 made of, for example, epoxy resin, is formed on the substrate 111 and surrounding the wiring posts 115 and the alignment post 113, so as to cover the substrate 111, the primary layer 112, the semiconductor chip 114 and the external protection layer 134. The insulation layer 116 can be formed in methods similar to the method for forming the insulation layer 16 in the first embodiment.

Chip connection wirings 121 formed by patterning by Cu plating are mounted on the insulation layer 116. The chip connection wirings 121 according to this embodiment 121 correspond to the chip connection wirings 21 in the first embodiment and can be formed by methods similar to the method for forming the chip connection wirings 21 in the first embodiment.

A resist layer (not shown) formed on the insulation layer 116 is exposed utilizing the alignment post 113 as a positioning reference for stepper exposure, and patterned. Then the wirings 121 are formed by Cu plating using the resist pattern. The alignment post 113 gives the same effects and advantages as that given by the alignment posts 13 in the first embodiment. Therefore, the accuracy of positioning the resist pattern and therefore positioning wirings becomes improved, resulting in occurrence of connection failures being reduced.

A solder resist layer 122, a Ni/Au plating layer 123 and solder balls 124 having structures similar to those of the solder resist layer 22, the Ni/Au plating layer 23 and the solder balls 24, respectively, in the first embodiment are formed to complete the built-in chip type substrate. Similar to the first embodiment, on a surface of the substrate 111 opposing the insulation layer 116, an insulation layer 117 made of the same material as that of the insulation layer 116 can be formed. The insulation layer 117 can alleviate stress in the substrate 111 caused by the insulation layer 116 to suppress warping of the substrate 111.

The substrate according to this embodiment is divided into pieces by dicing along lines 137 if necessary, to obtain built-in chip type substrates containing a semiconductor chip.

The alignment post 113 in this embodiment has a height (from a portion contacting the primary layer 112 to the top of the insulation layer 116) of, for example, 100 μm, but is not limited to this size.

A cross section of the alignment post 113 is substantially a square having sides 80 μm long, but is not limited to this shape or size.

The alignment post only has to have a shape that can be recognized as a positioning reference for aligning stepper apparatus.

The alignment post according to this embodiment is formed by Cu plating, but is not limited to thereto, and can be formed by various materials and methods.

Although the present invention is explained above with reference to preferable embodiments, the present invention is not limited to the specific embodiments and can be varied and modified within the scope of the attached claims.

INDUSTRIAL APPLICABILITY

According to the present invention, in manufacturing built-in chip type substrates containing a semiconductor chip, the positioning accuracy of wirings connected to semiconductor chips is much improved and connection failures are reduced.

The present application is based on Japanese Priority Application No. 2004-161505 filed on May, 31, 2004 with the Japanese Patent Office, the entire contents of which are hereby incorporated by reference.

What is claimed is:

1. A method of fabricating a built-in chip type substrate containing a semiconductor chip comprising:

forming an alignment post on a substrate having substantially planar surface without holes therethrough;

mounting the semiconductor chip on a predetermined surface of the substrate; and forming a chip connection wiring connected to the semiconductor chip mounted on the substrate surface, wherein the alignment post is used for positioning the chip connection wiring, wherein the built-in chip type substrate is comprised of the semiconductor chip mounted on the substrate.

2. The method of fabricating a built-in chip type substrate as claimed in claim 1, wherein the alignment post is used for positioning stepper exposure of resist that patterns the chip connection wiring.

3. The method of fabricating a built-in chip type substrate as claimed in claim 1, wherein the chip connection wiring is formed on an insulation layer formed on the semiconductor chip.

4. The method of fabricating a built-in chip type substrate as claimed in claim 1, wherein the alignment post is used for positioning the semiconductor chip to be mounted on the substrate.

5. The method of fabricating a built-in chip type substrate as claimed in claim 1, wherein the alignment post is formed by Cu plating.

* * * * *

UNITED STATES PATENT AND TRADEMARK OFFICE
CERTIFICATE OF CORRECTION

| | | |
|---|---|---|
| PATENT NO. | : 7,250,329 B2 | Page 1 of 1 |
| APPLICATION NO. | : 11/141421 | |
| DATED | : July 31, 2007 | |
| INVENTOR(S) | : Takaharu Yamano et al. | |

It is certified that error appears in the above-identified patent and that said Letters Patent is hereby corrected as shown below:

Title page, insert:

Section (30) Foreign Application Priority Data
    May 31, 2004 2004-161505 (JP)

Signed and Sealed this

Twentieth Day of May, 2008

JON W. DUDAS
*Director of the United States Patent and Trademark Office*